United States Patent
Teo et al.

(10) Patent No.: US 11,211,482 B2
(45) Date of Patent: Dec. 28, 2021

(54) AND GATE BASED ON BALLISTIC ELECTRONS

(71) Applicant: Mitsubishi Electric Research Laboratories, Inc., Cambridge, MA (US)

(72) Inventors: Koon Hoo Teo, Lexington, MA (US); Nadim Chowdhurry, Cambridge, MA (US)

(73) Assignee: Mitsubishi Electric Research laboratories, Inc., Cambridge, MA (US)

( * ) Notice: Subject to any disclaimer, the term of this patent is extended or adjusted under 35 U.S.C. 154(b) by 112 days.

(21) Appl. No.: 16/808,423

(22) Filed: Mar. 4, 2020

(65) Prior Publication Data
US 2021/0280704 A1 Sep. 9, 2021

(51) Int. Cl.
| | |
|---|---|
| *H01L 29/778* | (2006.01) |
| *H01L 29/20* | (2006.01) |
| *H01L 29/423* | (2006.01) |
| *H01L 29/205* | (2006.01) |
| *H03K 19/0944* | (2006.01) |
| *G06N 10/00* | (2019.01) |

(52) U.S. Cl.
CPC ...... *H01L 29/7786* (2013.01); *H01L 29/2003* (2013.01); *H01L 29/205* (2013.01); *H01L 29/42356* (2013.01); *H01L 29/7787* (2013.01); *G06N 10/00* (2019.01); *H03K 19/0944* (2013.01)

(58) Field of Classification Search
None
See application file for complete search history.

(56) References Cited

PUBLICATIONS

Seo, M. "Multi-Valued Logic Gates based on Ballistic Transport in Quantum Point Contacts" Sci. Reports 4, Jan. 22, 2014 pp. 3806-1-3806-5 (Year: 2014).*
Matioli, E. "Room-Temperature Transport in III-Nitride Heterostructures" Nano Lett. 15, 2 Jan. 23, 2015 pp. 1070-1075 (Year: 2015).*
Thathachary, A. "Electron Transport in Multigate InxGa1-xAs Nanowire FETs: From diffusive to Ballistic Regimes at Room Temperature" Nano Lett. 14, 2 Jan. 1, 2014 pp. 626-633 (Year: 2014).*

(Continued)

*Primary Examiner* — Grant S Withers
(74) *Attorney, Agent, or Firm* — Gennadiy Vinokur; Hironori Tsukamoto

(57) ABSTRACT

An AND-gate device having a structure arms, a channel from a first arm and a second arm extends to a channel of a third arm. When a current from a first voltage flowing from a first electrode of the first arm to a second electrode of the second arm, a flow of electrons is generated that flows through the third arm channel from the channel of the first and second arms to the third arm channel. At least two input structures are positioned in series in the third arm. Each input structure includes a fin structure having a gate controlled by an individual voltage applied to an electrode which induces an electric-field structure that shifts by an amount of the voltage. The controllable gate opening changes a depletion width, causing an amount of flow of ballistic electrons to pass through the channel. A sensor detects the ballistic electrons.

11 Claims, 11 Drawing Sheets

(Fin structures positioned in series)

(56) References Cited

PUBLICATIONS

Wolpert, D. "NAND Gate Design for Ballistic Deflection Transistors" IEEE Trans, on Nanotech. 10(1) Feb. 2011 pp. 150-154 (Year: 2011).*

Santoruvo, G. "Magneto-ballistic transport in GaN nanowires" Appl. Phys. Lett. 109 Sep. 7, 2016 p. 103102-1-103102-4 (Year: 2016).*

* cited by examiner

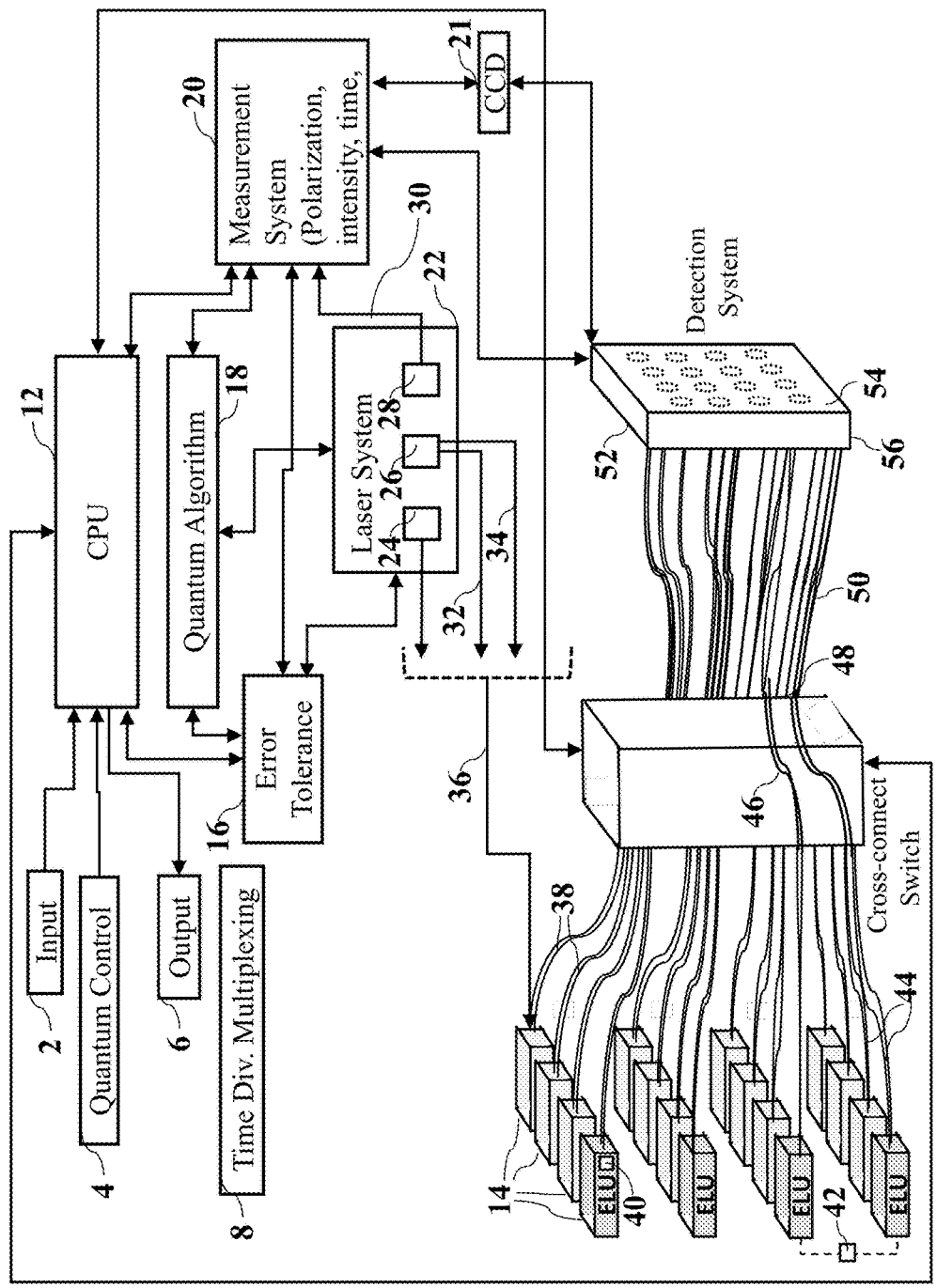
FIG: 1A
(Experimental Conventional Schematic)

(Fin structures positioned in series)

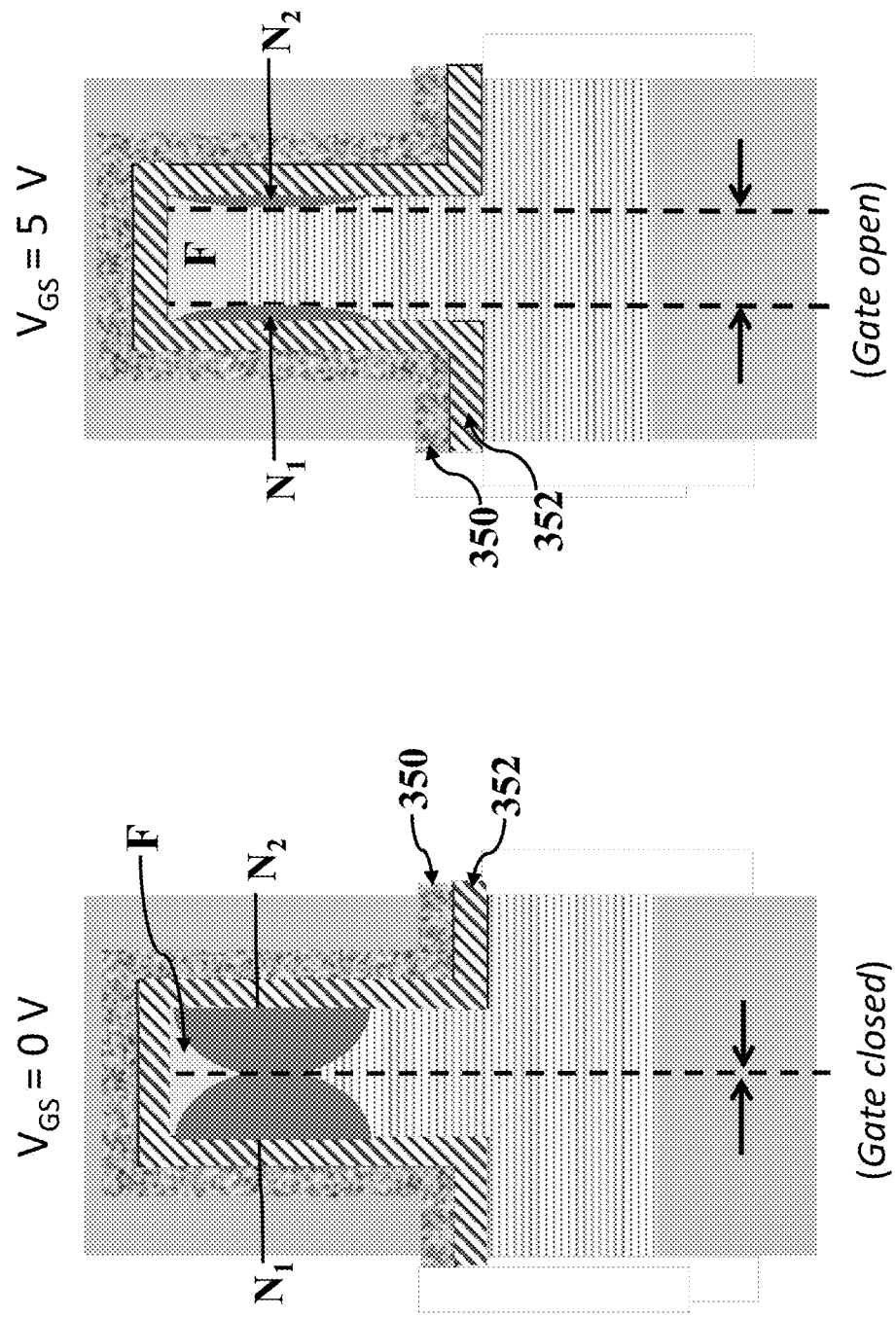

FIG. 5A

| Vin1 | Vin2 | Y |
|------|------|---|
| 0 | 0 | 0 |
| 0 | 1 | 0 |
| 1 | 0 | 0 |
| 1 | 1 | 1 |

Truth Table

FIG. 5B

| Vin1 (V) | Vin2 (V) | Y (Conductance) |
|----------|----------|-----------------|
| 0 V | 0 V | Low |
| 0 V | 5 V | Low |
| 5 V | 0 V | Low |
| 5 V | 5 V | High |

Input and Output voltage and conductance states

AND GATE BASED ON BALLISTIC ELECTRONS

FIELD

The present disclosure relates to the field of semiconductor devices, and more particularly, the field of gate controlled semiconductor devices, such as a compact AND-gate device.

BACKGROUND

Superconductor electronics (SCE) based on Josephson junctions (JJs) offers several options in the beyond Moore's law timeframe. Digital superconductor electronics based on single flux quantum (SFQ) logic is an area being researched to further understand SFQ logic in several logic families at an integration level up to about one million devices per chip. Superconductor electronics has been seen as an option for supercomputers since its inception in the 1960s, although the term "supercomputer" has broadened to include data centers. Quantum information processing (QIP) is a rapidly evolving area that includes areas such as quantum computing and quantum artificial intelligence. Quantum computers have been seen as ultra-powerful computers in limited domains since the discovery of Shor's algorithm for factoring numbers.

For example, a quantum computer is a computational system that uses collective quantum-mechanical phenomena of atoms at a high quantum degenerate regime, to process data. Unlike digital computers in which data is encoded into binary digits (bits) in one of two definite states ("0" or "1"), the quantum computation requires data to be encoded into qubits (quantum bits), where a single qubit can represent a "1", a "0", or any quantum superposition of the two qubit states. In general, a quantum computer with N qubits can be in an arbitrary superposition of up to $2^N$ different states simultaneously, i.e., a pair of qubits can be in any quantum superposition of four states, and three qubits in any superposition of eight states. Wherein, large-scale quantum computers may be to solve certain problems much more quickly than digital computers. In the operation of a quantum computer, the computations are initialized by setting the qubits in a controlled initial state. By manipulating those qubits, predetermined sequences of quantum logic gates are realized that represent the problem to be solved, called a quantum algorithm. Quantum algorithms, such as Shor's algorithm, Simon's algorithm, etc., run faster than any possible probabilistic classical algorithm. Quantum algorithms are often non-deterministic, as they provide the correct solution only with a certain known probability. The computation is finalized with a measurement, which collapses the system of qubits into one of the $2^N$ pure states, where each qubit is purely "0" or "1".

A number of different types of quantum computers have been developed. For example, a trapped ion quantum computer is a type of quantum computer in which ions, or charged atomic particles, can be confined and suspended in free space using electromagnetic fields. Qubits are stored in stable electronic states of each ion, and quantum information can be processed and transferred through the collective quantized motion of the ions in the trap (interacting through the Coulomb force).

U.S. Pat. No. 5,793,091A deveoped quantum computer architecture based upon arrays of elliptical ion traps. Each ion trap contains multiple ions, with each ion storing a physical qubit. Single qubit operations on ions are performed using properly timed laser pulses. Two qubit and quantum communication operations between ions in a single trap are mediated by collective phonon modes of the trapped ions. Quantum communication between ions in different traps is accomplished by placing the traps in a cavity, and using the photon cavity modes to mediate between the designated spatially separated ions. However, the U.S. Pat. No. 5,793,091A architecture does not address the classical control electronics and software necessary to perform the various quantum algorithms. Additionally, the physical location of the ion traps must be such that a cavity photon mode is able to transmit quantum information from one trap to another; distributed ion traps are not supported, and error-correction is also not addressed by the architecture. Also, the U.S. Pat. No. 5,793,091A architecture fails to provide all the components necessary for a complete architecture for a quantum computer: local quantum computation, distributed quantum computation, classical control electronics, classical control software, and error-correction.

Accordingly, with the rise of quantum computing, there is need to overcome the problems with conventional electronics that do not work properly in sub-4 K temperatures because of carrier freeze-out effect, and to improve quantum computer control electronics for quantum computing by improving components of the quantum computer.

SUMMARY

The present disclosure relates to relates to semiconductor devices, and more particularly, the field of gate-controlled semiconductor devices, such as a compact AND gate device.

Some embodiments of the present disclosure include a epitaxial layer for a semiconductor device that consists of III-N heterostructure preferably InAlN/GaN. Wherein, a Indium concentration can be tuned to lattice match with GaN providing higher electron mobility which is essential to generate ballistic electrons, according to aspects of the present disclosure. At least one fabricated compact AND-gate device of the present disclosure includes a voltage applied between an electrode of a first arm and an electrode of a second arm of a cross shaped structure so as to generate high velocity electrons/ballistic electrons (i.e. for GaN this could be around $2 \times 10^7$ cm. sec$^{-1}$). These ballistic electrons then go to a third arm that also has a voltage applied to an electrode, wherein fin shaped structures are fabricated in the third arm, followed by oxide and a gate metal deposition wrapping around the fins.

In particular, the AND gate can consist of two (2) single fins connected in series. For example, the electrons can only pass through these two (2) fins, such that a width of an aperture can be increased or decreased through which electrons can pass, an amount of the width of the aperture depends on a depletion width. This depletion width can be controlled by applying bias at each gate that wraps around the fins. The depletion width can be governed by an equation: Depletion width, $d = \alpha \times V_{GS}^{0.5}$, wherein the parameter $\alpha$ is dependent on gate oxide thickness, 2-DEG concentration, barrier thickness such as an AlGaN thickness, Fin-width and oxide interface charge density. Note that the aperture width is a function of gate voltage.

However, in order to better appreciate the challenges, overcome by the present disclosure, one needs to gain insight about some of the conventional problems of today's conventional quantum computer components. An initial challenge to overcome with conventional quantum computer components is developing a quantum computer that eliminates the requirement of having to use conventional electronic equipment to obtain a working quantum computer. In particular, the present disclosure has made several realizations that overcome using conventional electronics by creating a single device for quantum computing that includes a compact AND-gate, this single device essentially combines the features of conventional electronic equipment with the components of quantum computing, i.e. without having to use conventional electronics. At least one reason to eliminate using conventional electronic components with quantum computing components is the conventional electronics operate at one temperate, i.e. room temperature, and the quantum computing components operate at a different temperature, i.e. at sub-zero temperature.

Conventional electronics used with quantum computing are utilized for qubit control and read-out (i.e., shaping electrical pulses, amplification, etc.). For example, a qubit (or quantum bit) is a basic container of information in a quantum computer, which replaces the conventional basic container of information, i.e. "a bit", in the conventional computer. Conventional electronic components operate at room temperature, whereas most qubits of quantum computing operate at near absolute zero, which creates a requirement to support electronics that can operate at millikelvin (mK) operating temperatures, to avoid unacceptable cooling load. Conventional electronics do not work properly in sub-4 K temperature because of carrier freeze-out effect. Conventional electronics do not operate at lower temperature limits is due to the temperature effect of lowering the ionization energy of dopants in the conventional electronics. Dopants are impurity elements added to a semiconductor crystal to form electrical junctions or boundaries between "n" and "p" regions in the crystal. An n-type region is an area containing an excess of electrons for conduction of electricity. A p-type region contains an excess of electron holes or acceptors. Dopants usually require some energy to ionize and produce carriers in the semiconductor. This energy is usually thermal, and if the temperature is too low, the dopants will not be sufficiently ionized and there will be insufficient carriers, i.e. a lack of carriers means there is little or no current flow. The result is a condition called "freeze-out."

Semiconductor devices operate by means of the movement of charge carriers (electrons and holes). The key is controlling their movement through arrangement of n-type, p-type, and intrinsic regions (and insulators) that have different electrical properties. A simple example is the p-n junction, which as a result of different doping on the two sides of the junction, can favor carrier movement in one direction across the junction but not in the opposite direction. Which means that temperature is one of the most important parameters in semiconductors components. When the absolute scale is mentioned in the present disclosure, this refers, in degrees Kelvin, which is written as 300 K or 0 K, etc., without a degree symbol because it is absolute temperature. Temperature is very important at least because the average energy of a solid, and its components (atoms, electrons, etc.), is measured by its temperature. The higher the temperature, the more (thermal) energy is available to be used by the atoms and electrons. In regard to temperature and the operation of conventional "electronic" devices, temperature has a significant impact on the behavior of electrons, which means, temperature must have a significant impact on the behavior of electronic device components. For example, an average kinetic energy of an electron in a solid is linearly proportional to the temperature of the solid, such that at room temperature, an average velocity of a free electron is approximately $10^7$ cm/sec. Whereas, at an average velocity of a free electron at absolute zero is about at the electron's lowest energy state. Thus, there many challenges to figuring out how electronics can work in cryogenic temperatures, as well as a need for the electronics to operate at extremely energy efficient levels.

At least one realization of the present disclosure is to construct an AND-gate device that eliminates the need for conventional electronics, and essentially, combines the utility of conventional electronics into a single device that can operate at sub-zero temperatures. However, this realization is contrary to conventional thinking since today's quantum computing requires a significant amount of classical information processing via conventional electronic components, i.e. control processing unit, to compute the quantum operations needed to correct errors based upon measured syndrome results, along with requiring a lot of extra time for this processing that slows the operation of the quantum computer. For example, an initial experimentation started with a modular quantum computer architecture with hierarchy of interactions between qubits that supported the scaling of a large number of qubits, and for forming quantum computational circuits using conventional AND-gates. However, in order for this test quantum computer to operate, this experimentation architecture required a control processor unit (CPU) to process an efficient error correction mechanism and intelligent coding schemes for a fault-tolerance of operation. This testing approach was not further tested because it failed to meet some of the goals of the present disclosure of creating a single device operating at a single temperate to result in aspects of quantum computing.

Another realization of the present disclosure, discovered from further experimentation, is utilizing a polarization based doping as an effective way to circumvent the problem of operating components similar to a conventional quantum computing device that requires two operational temperatures, and instead, having a single device with components (i.e. an AND-gate) operating at sub-zero temperature, i.e. at a single operational temperature, since the carriers are not provided by the dopants. The polarization doping is used to generate free electrons. This free electrons are created at the interface of two semiconductor materials having two different spontaneous polarization. Since the proposed method use polarization rather than doping to create free carriers the free carrier density does not depend on the temperature. For example, some embodiments of the present disclosure include a single device with a compact AND-gate that utilizes the polarization based doping to generate free electrons at sub-zero temperatures, wherein the free electrons pass into a channel that has a gate or two gates in series. The gate opens and closes based on an amount of biasing voltage to the respective electrode of the fin structure. The voltage is applied on the gate to change a depletion width which in turn changes an aperture through which electrons are passing through. The electrons pass through the gate(s), where a sensor(s) located at the end of the third arm can detect an amount of the conductance. The detected conductance can be varied orders of magnitude based on applying the gate bias.

Some embodiments of the present disclosure include a compact AND-gate structure that includes an epitaxial layer that consists of III-N heterostructure preferably InAlN/GaN. Wherein, the Indium concentration can be tuned to lattice match with GaN in order to provide higher electron mobility which is essential to generate ballistic electrons.

The AND-gate structure for some embodiments of the present disclosure also include a voltage that is applied between a first and a second arm of a cross shaped structure to generate high velocity electrons/ballistic electrons. These ballistic electrons then go to a third arm. Wherein, two fin structures are fabricated in the third arm, followed by oxide and gate metal deposition wrapping around the fins. A voltage can be applied on the gate to change a depletion width, which in turn, changes an aperture through which electrons are passing through the two fin structures.

Practical Applications

Some benefits and advantages of a compact AND-gate for quantum computing is that an amount of time for a quantum computer to run several times, that amount of time, is still exponentially faster to arrive at a result of a very hard problem to solve, than using a conventional computer. An amount of time for a single run-time for a conventional computer to work on the same very hard problem, equates or corresponds to the amount of time the quantum computer with a compact AND-gate takes run several times. In regard to the many complex problems that need to be solved in today's demands, the need for quantum computing with a compact AND-gate is characterized by this 'very hard' exponential growth in problem solving complexity. For example, the embodiments of the present disclosure with a compact AND-gate can thus provide for faster computational times for optimization problems, machine learning, sampling of large data sets, forecasting etc, by non-limiting example. In addition, the embodiments of the present disclosure with a compact AND-gate can address the growing need for the solving these complex problems via the quantum computing attributes of the present disclosure.

Specifically, what makes quantum computers with a compact AND-gate unique is based on introducing two principles of quantum mechanics crucial for their operation, superposition and entanglement.

Superposition is the counterintuitive ability of a quantum object, like an electron, to simultaneously exist in multiple "states." With an electron, one of these states may be the lowest energy level in an atom while another may be the first excited level. If an electron is prepared in a superposition of these two states it has some probability of being in the lower state and some probability of being in the upper. A measurement will destroy this superposition, and only then can it be said that it is in the lower or upper state.

Some embodiments of the present disclosure provide a platform with a compact AND-gate such that this configuration of quantum computing hardware can be built on control electronics (CPU) unit. At least one aspect of this arrangement is with a chip integration on the CPU and quantum computing, results in making the whole Quantum computing process even faster, i.e. when compared to convention systems that require two separate temperature zones, one for conventional electronics at room temperature and the other for quantum computing at zero temperatures. For example, understanding superposition makes it possible to understand the basic component of information in quantum computing, the qubit. In conventional computing, bits are transistors that can be off or on, corresponding to the states 0 and 1. In qubits such as electrons, 0 and 1 simply correspond to states like the lower and upper energy levels discussed above. Qubits are distinguished from classical bits, which must always be in the 0 or 1 state, by their ability to be in superpositions with varying probabilities that can be manipulated by quantum operations during computations.

Entanglement is a phenomenon in which quantum entities are created and/or manipulated such that none of them can be described without referencing the others. Individual identities are lost. This concept is exceedingly difficult to conceptualize when one considers how entanglement can persist over long distances. A measurement on one member of an entangled pair will immediately determine measurements on its partner, making it appear as if information can travel faster than the speed of light. As noted above, some embodiments provide a platform with a compact AND-gate for an integrated quantum computer, such that all this quantum computing hardware can be built on control electronics (CPU) unit this on chip integration of CPU and quantum computing making the whole Quantum computing process even faster.

One way of thinking of quantum computing is that the computing tries every possible answer to solve a problem in parallel. In reality a quantum computer leverages entanglement between qubits and the probabilities associated with superpositions to carry out a series of operations (a quantum algorithm) such that certain probabilities are enhanced (i.e., those of the right answers) and others depressed, even to zero (i.e., those of the wrong answers). When a measurement is made at the end of a computation, the probability of measuring the correct answer should be maximized. The way quantum computers leverage probabilities and entanglement is what makes them so different from classical computers. As noted above, some embodiments provide a platform with a compact AND-gate for an integrated quantum computer.

Some reasons why quantum computed is needed can be the promise of developing a quantum computer sophisticated enough to execute Shor's algorithm for large numbers, i.e. which has been a primary motivator for advancing the field of quantum computation. For example, if a quantum computer with a sufficient number of qubits could operate without succumbing to quantum noise and other quantum-decoherence phenomena, then Shor's algorithm could be used to break public-key cryptography schemes, such as the widely-used Rivest-Shamir-Adleman (RSA) scheme, i.e. RSA encryption is based on a simple idea: prime factorization, which is an algorithm used to encrypt and decrypt messages. As noted above, quantum computers can most likely help with specific problems, including problems related to optimization, which can play key roles in everything from defense to financial trading. As noted above, some embodiments provide a platform with a compact AND-gate for an integrated quantum computer that can address many of the above challenges.

Multiple additional applications for qubit systems that are not related to computing or simulation also exist, which can include: (1) quantum sensing and metrology, which leverage the extreme sensitivity of qubits to an environment to realize sensing beyond the conventional shot noise limit; and (2) quantum networks and communications, which may lead to revolutionary ways to share information. As noted above, some embodiments provide a platform with a compact AND-gate for an integrated quantum computer that can address some of the above challenges.

According to an embodiment of the present disclosure, an AND-gate device forming a channel, and includes an epitaxial layer including a III-N heterostructure such as InAlN/GaN. Wherein an amount of an In concentration of the InAlN/GaN is tuned to lattice match with GaN, resulting in electron mobility to generate ballistic electrons. At least two structures positioned in series in the channel, such that at an end of the channel includes an ohmic contact Y. Wherein each structure includes a fin structure located in the channel, wherein the fin structure includes a gate formed transversely to a longitudinal axis of the channel. The gate is controlled using a voltage over the fin structure. Such that the fin structure is formed to induce an energy-field structure that is shifted by an amount of the voltage to control an opening of the gate that the flow of ballistic electrons is passing through, which in turn changes a depletion width, subjecting the ballistic electrons to interference. Wherein the AND-gate device is turned on by applying an amount of the voltage, and turned off by applying no amounts of the voltage.

Another embodiment of the present disclosure, an AND-gate device including an epitaxial layer forming a channel, and includes a III-N heterostructure such as InAlN/GaN. Wherein an amount of an In concentration of the InAlN/GaN is tuned to lattice match with GaN, resulting in electron mobility to generate ballistic electrons. At least two structures positioned in series in the channel, such that at an end of the channel includes an ohmic contact Y. Wherein the ohmic contact Y serves as an output terminal to detect a conductance state for the two structures. Wherein each structure includes a fin structure located in the channel. The fin structure includes a gate formed transversely to a longitudinal axis of the channel, and the gate is controlled using a voltage over the fin structure. Such that the fin structure is formed to induce an energy-field structure that is shifted by an amount of the voltage to control an opening of the gate that the flow of ballistic electrons is passing through, which in turn changes a depletion width, subjecting the ballistic electrons to interference. At least one sensor located at the end of the channel. Wherein the AND-gate device is turned on by applying an amount of the voltage, and turned off by applying no amounts of the voltage.

Another embodiment of the present disclosure, an AND-gate device having a first arm, a second arm and a third arm. Such that a channel from the first and second arms extends to a channel of the third arm. When a current from a first voltage is flowing from a first electrode of the first arm to a second electrode of the second arm, a flow of ballistic electrons are generated that flow through the third arm channel from the channel of the first and second arms to the third arm channel. The AND-gate including at least two structures are positioned in series in the third arm channel, each structure includes a fin structure located in the third arm. Wherein the fin structure includes a gate formed transversely to a longitudinal axis of the fin structure, and is controlled using an individual voltage applied to an electrode of the fin structure. Wherein the fin structure is formed to induce an electric-field structure that is shifted by an amount of the voltage to control an opening of the gate that the flow of ballistic electrons is passing through. At least one sensor is positioned at an end of the third arm. Wherein the AND-gate device is turned on by applying an amount of voltage to both electrodes of the at least two fin structures, and turned off by applying no amounts of voltage to either of the electrodes of the at least two fin structures.

According to another embodiment of the present disclosure, an AND-gate device including a structure having a first arm, a second arm and a third arm. Such that a channel from the first and second arms extends to a channel of the third arm. When a current from a first voltage is flowing from a first electrode of the first arm to a second electrode of the second arm, a flow of ballistic electrons are generated that flow through the third arm channel from the channel of the first and second arms to the third arm channel. Wherein the first voltage and second voltage are connected to a same ground terminal. At least two input structures are positioned in series in the third arm channel. Each input structure includes a fin structure located in the third arm, wherein the fin structure includes a gate formed transversely to a longitudinal axis of the fin structure, and is controlled using an individual voltage applied to an electrode of the fin structure. Wherein the fin structure is formed to induce an electric-field structure that is shifted by an amount of the voltage to control an opening of the gate that the flow of ballistic electrons is passing through. At least one sensor is positioned at an end of the third arm, and is configured to operationally detect an amount of conductance within a range of a $10^{-2}$ S amount of conductance to a $10^3$ S amount of conductance. Wherein the AND-gate device is turned on by applying an amount of voltage to both electrodes of the at least two fin structures, and turned off by applying no amounts of voltage to either of the electrodes of the at least two fin structures.

According to another embodiment of the present disclosure, an AND-gate device having a structure having a first arm, a second arm, a third arm and fourth arm. Such that a channel from the first and second arms extends to a channel of the third arm. When a current from a first voltage is flowing from a first electrode of the first arm to a second electrode of the second arm, a flow of ballistic electrons are generated that flow through the third arm channel from the channel of the first and second arms to the third arm channel. Wherein the first voltage and second voltage are connected to a same ground terminal. Wherein the fourth arm is position to extend along a vertical axis above the second arm. The AND-gate including at least two input structures are positioned in series in the third arm, such that each input structure includes a fin structure located in the third arm. Wherein the fin structure includes a gate formed transversely to a longitudinal axis of the fin structure, and is controlled using an individual voltage applied to an electrode of the fin structure. Wherein the fin structure is formed to induce an electric-field structure that is shifted by an amount of the voltage to control an opening of the gate that the flow of ballistic electrons is passing through. At least one sensor is positioned at an end of the third arm, such that as voltage is applied to the electrodes of the at least two input structures, the at least one sensor detects ballistic electrons so as to detect an amount of conductance. Wherein the AND-gate device is turned on by applying an amount of voltage to both electrodes of the at least two fin structures, and turned off by applying no amounts of voltage to either of the electrodes of the at least two fin structures.

BRIEF DESCRIPTION OF THE DRAWINGS

The presently disclosed embodiments will be further explained with reference to the attached drawings. The drawings shown are not necessarily to scale, with emphasis instead generally being placed upon illustrating the principles of the presently disclosed embodiments.

FIG. 1A is a schematic diagram illustrating an experimental conventional quantum computer system constructed with aspects of conventional quantum computer architecture that was used to better understand the problems and technological constraints of convention quantum computing systems of today, which require two separate operating temperature zones;

FIG. 3A is a schematic diagram illustrating a cross-sectional of a longitudinal view from end one to end two of FIG. 2A, showing a single fin structure with the gate closed for a compact AND-gate, according to some embodiments of the present disclosure;

FIG. 3B is a schematic diagram illustrating a cross-sectional of a longitudinal view from end one to end two of FIG. 2A, showing a single fin structure with the gate opened for a compact AND-gate, according to some embodiments of the present disclosure;

FIG. 5A is a table illustrating a true table, according to some embodiments of the present disclosure;

FIG. 5B is a table illustrating input and output voltage and conductance states, according to some embodiments of the present disclosure;

Figure 1B:
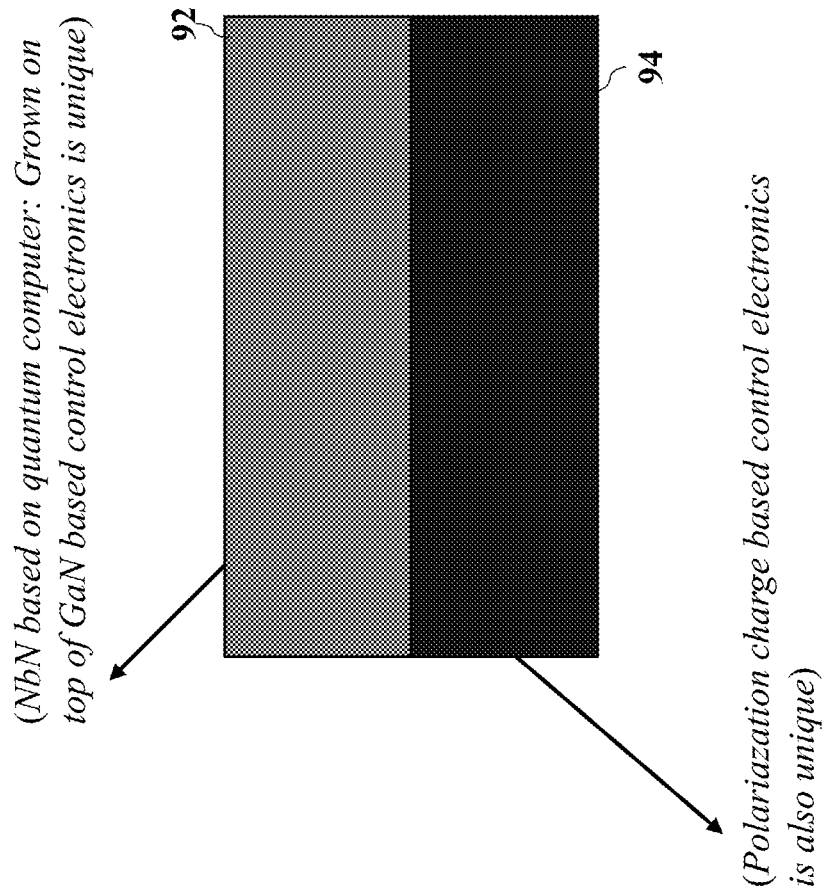
FIG. 1B is a schematic diagram illustrating components of quantum computing requiring a single device that operates at a single temperature, according to some embodiments of the present disclosure.

While the above-identified drawings set forth presently disclosed embodiments, other embodiments are also contemplated, as noted in the discussion. This disclosure presents illustrative embodiments by way of representation and not limitation. Those skilled in the art can devise numerous other modifications and embodiments, which fall within the scope and spirit of the principles of the presently disclosed embodiments.

DETAILED DESCRIPTION

FIG. 1A is a schematic diagram illustrating an experimental conventional quantum computer system constructed with aspects of conventional quantum computer architecture that was used to better understand the problems and technological constraints of convention quantum computing systems of today, which require two separate operating temperature zones.

As noted above, the components of conventional quantum computing require conventional electronics to operate at one temperature, i.e. room temperature, and the quantum computing components operate at sub-zero temperatures. For example, today's conventional quantum computing architecture does not address the classical control electronics and software constraints necessary to perform the various quantum algorithms, such that such classical hardware and software require operational temperate to be at room temperature. Specifically, conventional electronics used with conventional quantum computing are utilized for qubit control and read-out (i.e., shaping electrical pulses, amplification, etc.). Wherein, the conventional electronic components operate at room temperature, whereas, in contrast, qubits of quantum computing operate at near absolute zero. Which creates a requirement to support electronics that can operate at millikelvin (mK) operating temperatures, to avoid unacceptable cooling load. Conventional electronics do not work properly in sub-4 K temperature because of carrier freeze-out effect. Conventional electronics do not operate at lower temperature limits due to the temperature effect of lowering the ionization energy of dopants in the conventional electronics. However, this experimental quantum computer system 100 was constructed to assist in developing some of the embodiments of the present disclosure, so as to grasp a better understanding of the complex conventional quantum computing architecture, and how to create design and create a single device that operates at a single operating temperature.

Still referring to FIG. 1A, the experimental conventional quantum computer system 100 was constructed to include elementary logic units (ELUs) 40 interconnected through a scalable photonic interconnect network 15 that linked the ELUs 14 in a flexible configuration over large distances via fibers.

The conventional quantum computer architecture of the experimental quantum computer system 100 hosts qubits, where each ELU 14 includes a modular register of trapped atomic ion qubits, and where entangling quantum logic gates are mediated through the local Coulomb interactions between qubits. The atomic qubits within each ELU 14 are coupled to photonic quantum channels 38, and through a reconfigurable optical cross-connect switch 41, and position sensitive imager 56, the qubits between the different ELU's 14 may be entangled. The cross-connect switch includes input fibers 44 and output fibers 50 of output port 48, the output fibers 50 connect to the position sensitive imager 22. A beam splitter (not shown) is position between the switch 41 and the position sensitive imager 22. Detectors 55, 57 (i.e. 4 rows and 4 detectors per row of the position sensitive imager 22), each comprised of two fibers 58, 59 interfering on a beam splitter (not shown) and two detectors 55, 57, are connected to the respective output ports 48 of the switch 41. The switch 41 provides an optical path between any input fiber 44 to any output fiber 48.

Still referring to FIG. 1A, a conventional central processor unit (CPU) 24 receives input data 2 to be processed and computed, and controls the operation of the experimental quantum computer system 100 for execution of scheduled operations in accordance with a quantum algorithm 18 for realization of reconfigurable circuit schemes for quantum computing of the INPUT data 2 (i.e. using conventional electronics) with the purpose of producing the results of the computation, depicted as OUTPUT 6 (i.e. using conventional electronics). A conventional fault-error (or tolerance) mechanism 16 is operatively coupled to the ELUs 14, as well as to the switch 41, and CPU 12, and the scheduling scheme (not shown) supported by the quantum algorithm 18. Also, a gate 40 can be located in the EMU, and another gate 42 can be located between two EMU's. Wherein, the base unit of the quantum computer 100 is a collection of ELUs 14 which are qubit memories with local interactions.

A conventional laser unit 22 includes a laser 24, a mode-lock laser 26, a resonant laser 28, such that the laser unit 22 is operatively coupled to a conventional quantum control scheme 4 to produce required laser pulses for being applied to the qubits at different operational stages of the system. The lasers of the laser unit 22, each actuated to produce a laser pulse of specific characteristic needed at different stages of the computer operation. The state of each qubit is measured in a conventional measurement unit 20 by applying a pulse 30 of a resonant laser 28 of the laser unit 22 that results in state-dependent fluorescence that is imaged onto a multichannel photomultiplier tube for individual qubit state detection. When a constant state-dependent force is applied to the ion qubits, the multiple incommensurate modes generally remain entangled with the qubits following the interaction, thereby degrading the quantum gate fidelity.

Still referring to FIG. 1A, in the overall computational process supported by the conventional quantum computer architecture of the experimental quantum computer system 100, the system 100 requires a computational problem to be solved in accordance with instructions issued by the conventional CPU 12 in agreement with the algorithm 18. Noted is that the conventional electronics, (i.e. CPU 12, input 2, Quantum control 4, output 6, time divisional multiplexing 8, error tolerance 16, laser system 22, measurement system 20, and the conventional charge-coupled-device (CCD) imager) 21. However, all of the conventional electronics of the experimental quantum computer system 100 require an operational temperature to be at room temperature, i.e. a first temperature zone, whereas the quantum computing components operate at sub-zero temperatures, i.e. a second temperature zone.

FIG. 1B is a schematic diagram illustrating components of quantum computing requiring a single device that operates at a single temperature, according to some embodiments of the present disclosure. The top layer 92 Niobium Nitride (NbN) can be used to manufacture quantum Q-bits. The bottom layer 94 is a combination of III Nitride semiconductor layers, which can be used to manufacture control circuits as presented in the present disclosure, and control the Q-bits. This can be a three-dimensional (3D) platform to make compact quantum computers. Moreover, NbN when grown III Nitride semiconductor layers show super conducting behavior even beyond 10 K temperature. Therefore, the proposed platform can make a quantum computer operatable at higher temperature. This is significant because keeping the quantum computer close to zero K temperature is very costly. So, from this point of view, the propose embodiments of the present disclosure are significantly less costly and provide substantial benefits for manufacturing quantum computers.

Figure 2A:
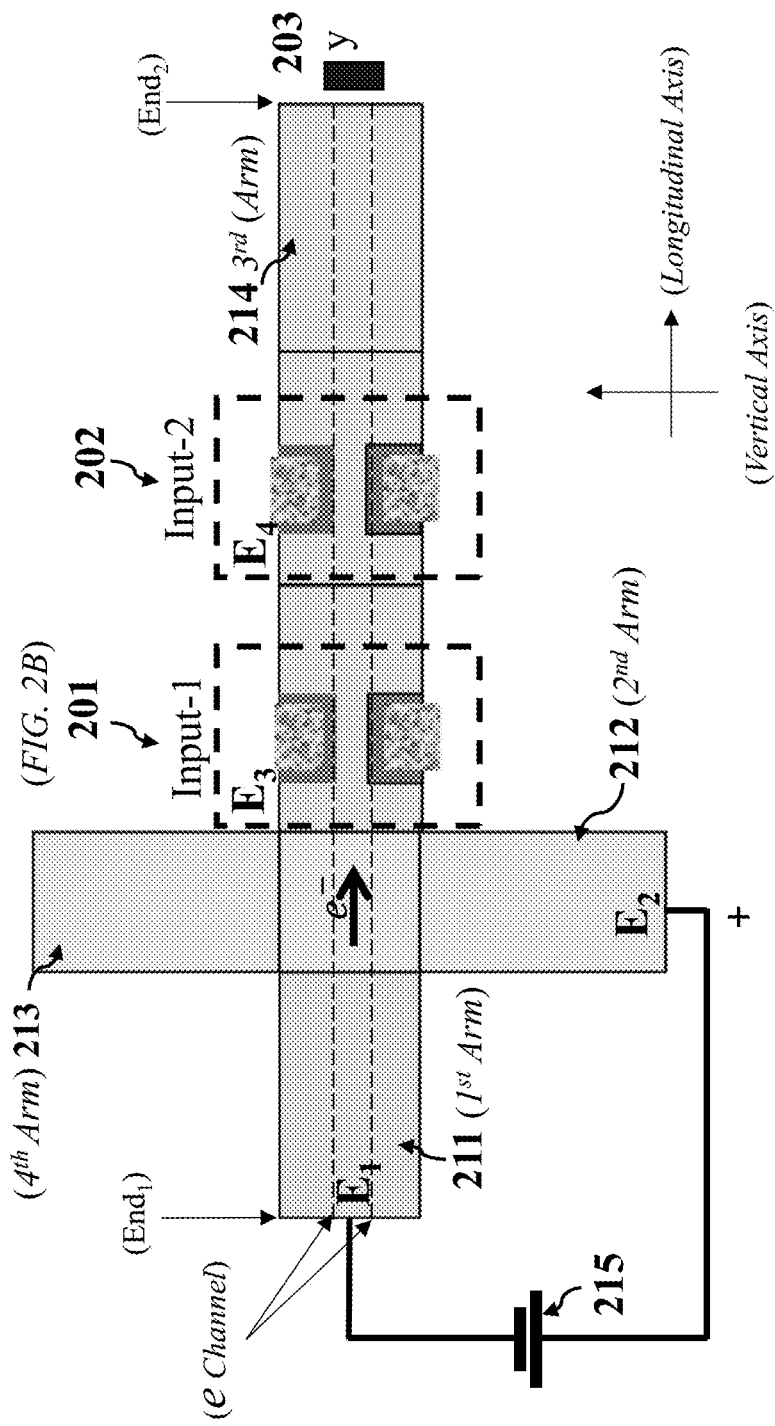
FIG. 2A is a schematic diagram illustrating a cross-sectional view of a top view an embodiment of a compact AND-gate of the present disclosure, according to some embodiments of the present disclosure.

FIG. 2A is a schematic diagram illustrating a cross-sectional view of a top view of an embodiment of a compact AND gate device of the present disclosure, according to some embodiments of the present disclosure. FIG. 2A shows the top view of a fabricated compact AND gate device, wherein a voltage 215 is applied between the first arm 211 located at end one ($end_1$) and a second arm 212 of a cross shaped structure to generate high velocity electrons/ballistic electrons $e^-$ (in GaN it could be around $2 \times 10^7$ cm. $sec^{-1}$). These ballistic electrons $e^-$ then go to the third arm 214 which ends at end two ($end_2$). At least two fin shaped structures 201, 202 are fabricated in the third arm 214 followed by oxide (see FIGS. 2B, 2C and 2D) and gate metal deposition (see FIGS. 2B, 2C and 2D) wrapping around the fin shaped structures 201, 202. Further the structural configuration of the compact AND-gate includes the two (2) fin shaped structures 201, 202 arranged and connected in series. Contemplated is that more than two fin shaped structures can be incorporated with the AND-gate device, which the number of fin shaped structures can depend upon a user's intended specific application(s).

FIG. 2A shows a fourth arm 213 that can be optionally included with the compact AND-gate device, but the fourth arm 213 not required for the AND-gate device to operate. While the ballistic electrons $e^-$ pass through the fin shaped structures 201, 202 (see FIG. 2B), an amount of ballistic electrons $e^-$ can depend on an amount of applied voltage to the electrodes of the fin shaped structures 201, 202 (see FIG. 2B), which results in opening/closing the gates (see FIG. 2B).

Further, a epitaxial layer of the compact AND gate device can include of a III-N heterostructure, which can be preferably InAlN/GaN. Here, the Indium concentration can be tuned to lattice match with GaN providing higher electron mobility which is essential to generate ballistic electrons $e^-$.

As noted above, the forth arm 213 of FIG. 2A is not required for the operation of the AND-gate device, however, the fourth arm 213 can be useful in determining whether there are ballistic electrons $e^-$ that can be detected. The detecting of the ballistic electrons $e^-$ is by measuring the applied voltage between a fourth electrode of the fourth arm 213 and a third electrode of the third arm 214. In the case of ballistic electrons $e^-$, the voltage measured between the third electrode $E_3$ of the third arm 214 and the fourth electrode $E_4$ of the fourth arm 214, would either be negative. or otherwise it will be zero.

Figure 2B:
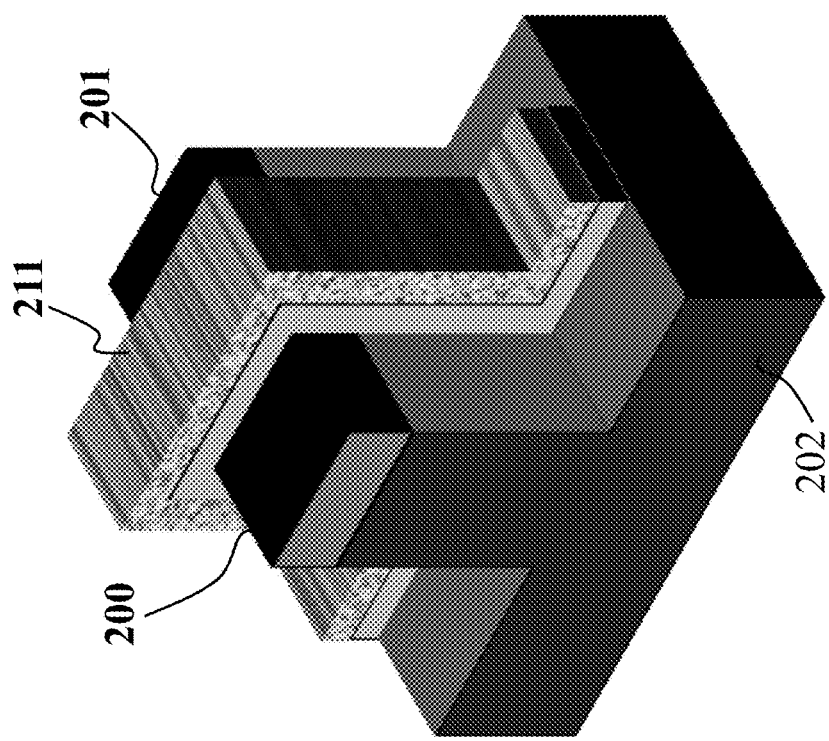
FIG. 2B is a schematic diagram illustrating a 3-D view of a fin shaped structure for a compact AND-gate, according to some embodiments of the present disclosure.

FIG. 2B is a schematic diagram is a schematic diagram illustrating a 3-D view of a Fin shaped structure of the compact AND-gate, according to some embodiments of the present disclosure. FIG. 2B shows the fin structure created on a base 202 and layers 200a and 200b, such that the layers 200a, 200b are both III-N layers. An oxide layer 201a, 201b is wrapped around the fin shaped structure, wherein the oxide layer can be of a material HfO2, SiO2 or any other insulating dielectric. The gate metal 211 can be formed by any metal having higher work-function of around 5 eV, such that a higher work function metal ensures that the channel is pinched off without any gate bias applied.

For example, the electrons can only pass through the fins and width of the aperture through which electrons can pass depends on the depletion width. This depletion can be controlled by applying bias at the gate that wraps around the fins. The depletion width is governed by the equation Depletion width, $d = \alpha \times V_{GS}^{0.5}$, wherein the parameter $\alpha$ is dependent on gate oxide thickness, 2-DEG concentration, AlGaN thickness, Fin-width and oxide interface charge density.

Figure 2C:
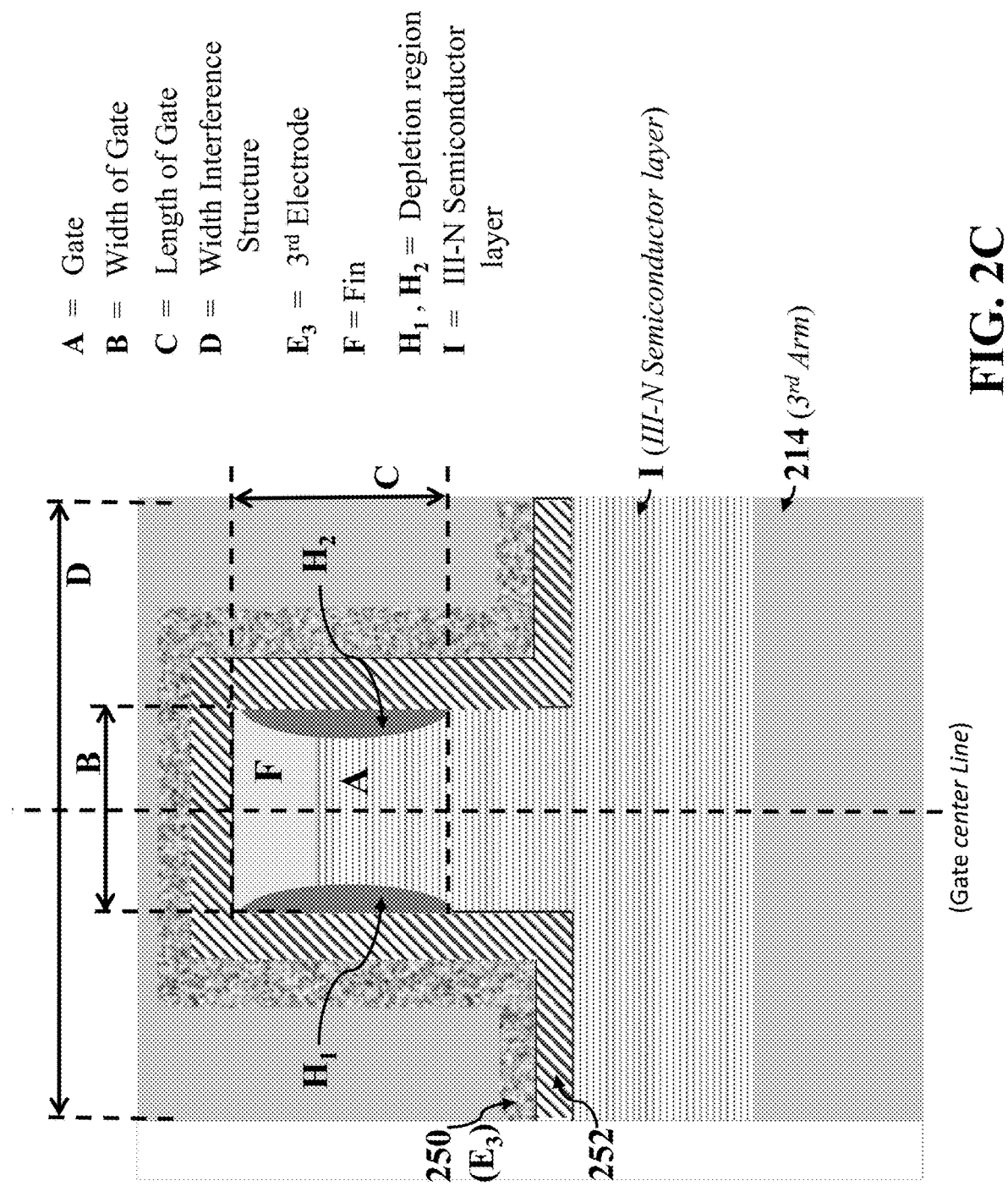
FIG. 2C is a schematic diagram illustrating a cross-sectional of a longitudinal view from end one to end two of FIG. 2A, showing a single fin structure for a compact AND-gate, according to some embodiments of the present disclosure.

FIG. 2C is a schematic diagram illustrating a cross-sectional of a longitudinal view from end one to end two of FIG. 2A, showing a single fin structure of the compact AND-gate, according to some embodiments of the present disclosure. The fin F has a width B. A a total width of the fin D includes the oxide 252 that wraps around the Fin F and the gate A, as well as the metal 250 of the third electrode. A semiconductor layer I of the third arm 214 includes a material such as III-N. The depletion width $H_1$, $H_2$ is caused by the work function difference between the metal 250 of the third electrode and the semiconductor layer I. The total depletion width has a height C.

Figure 2D:
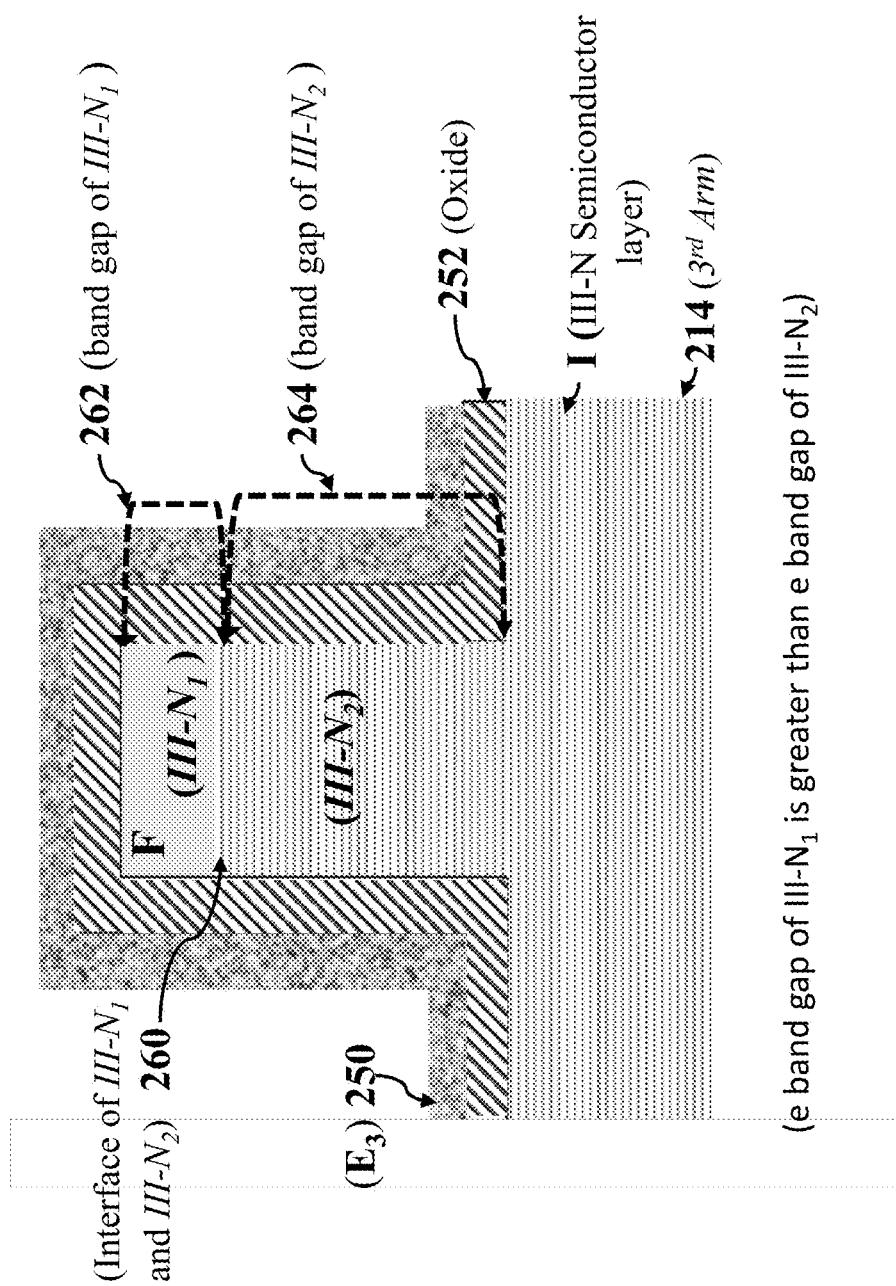
FIG. 2D is a schematic diagram illustrating a cross-sectional of a longitudinal view from end one to end two of FIG. 2A, showing some material compositions of the structure for a compact AND-gate, according to some embodiments of the present disclosure.

FIG. 2D is a schematic diagram illustrating a cross-sectional of a longitudinal view from end one to end two of FIG. 2A, showing some material compositions of the structure of the compact AND-gate, according to some embodiments of the present disclosure. The fin F can contain two III-N layers III-$N_1$ and III-$N_2$ of the third arm 214. In order to create free electrons at the interface 260 of III-Nitrides III-$N_1$ and III-$N_2$, a band gap 262 of III-$N_1$ is greater than the band gap 264 of III-$N_2$. The reason that band gap 262 of III-N$_1$ needs to be greater than the band gap of III-N$_2$, is so that a polarization difference between the two semiconductors III-N$_1$ and III-N$_2$ is positive, and to compensate for the positive immobile charge which gathers negative mobile electrons at the interface of II-N$_1$ 262 and III-N$_2$ 264. Such that these gathered negative mobile electrons are also known 2-DEG (2-dimensional electron gas).

FIG. 3A is a schematic diagram illustrating a cross-sectional of a longitudinal view from end one to end two of FIG. 2A, showing a single fin structure with the gate closed of the compact AND-gate, a depletion width for $V_{GS}$=0, according to some embodiments of the present disclosure. The gate metal 350 (E$_3$) can be a low work function for example 4 eV. A thickness of the oxide 352 may be about 5-10 nm, and can be chosen so that at a zero gate bias (gate closed), the depletion width N$_1$ and N$_2$ covers the whole fin-width (see B of FIG. 2C) leading to the closure of gate for the electrons. An aspect of the depletion widths which the gate is closed deters the electrons from passing through the fin F. In other words, the fin-width, AlGaN thickness, gate oxide thickness, gate metal work-function are chosen such that when no bias is applied at the gate, the width of the aperture through which the electrons can flow is zero nano-meter.

FIG. 3B is a schematic diagram illustrating a cross-sectional of a longitudinal view from end one to end two of FIG. 2A, showing a single fin structure with the gate opened, a depletion width for $V_{GS}$=5 V, according to some embodiments of the present disclosure. When a 5 V gate voltage is applied at the metal 350 of the electrode. The depletion widths N$_1$ and N$_2$ get reduced leading to an opening of the gate, so that the electrons can pass through the gate.

Figure 4:
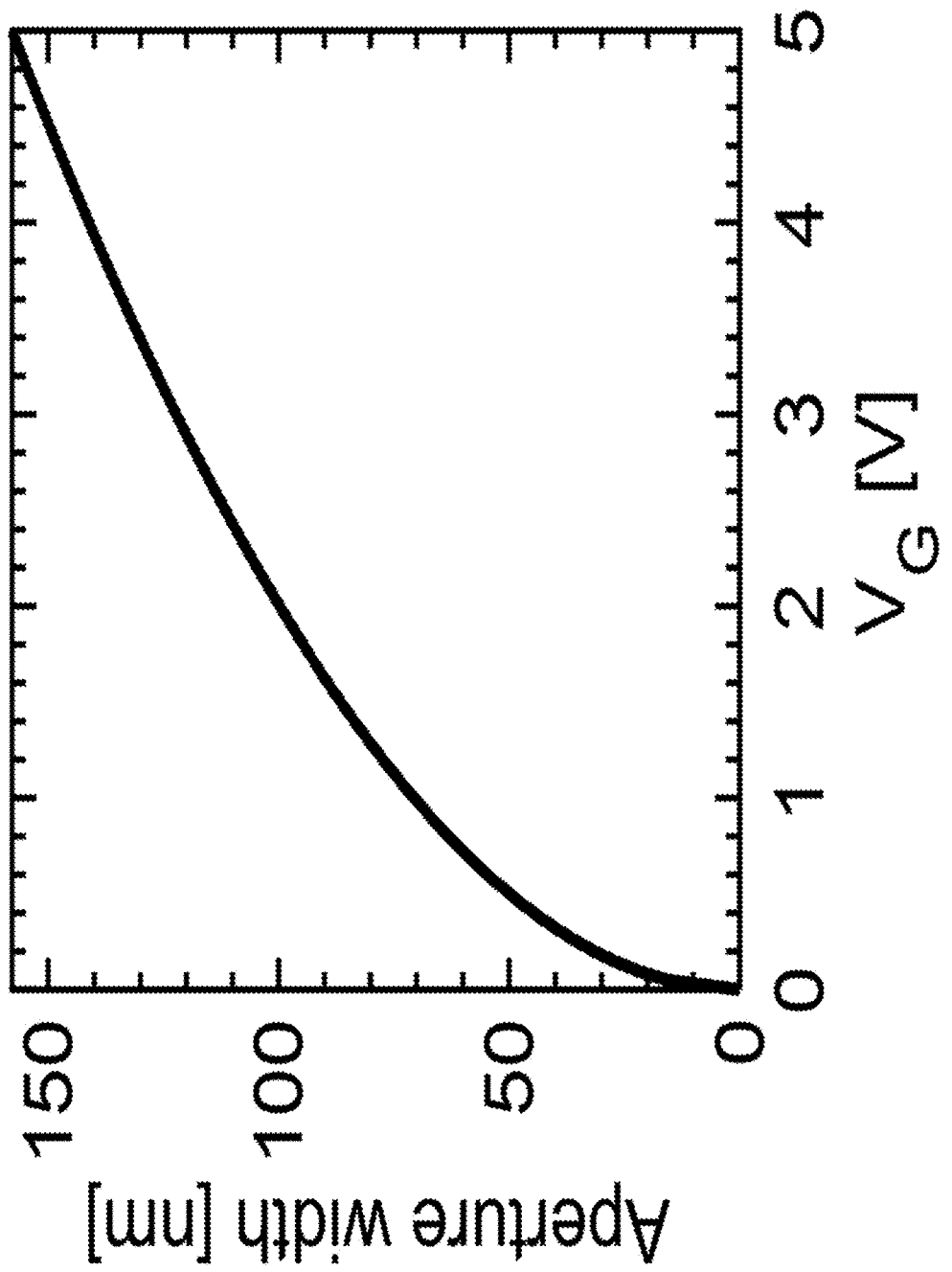
FIG. 4 is a graph illustrating voltage is applied on the gate to change the depletion width which in turn changes the aperture through which electrons are passing through, i.e. shows the aperture width as a function of gate voltage, according to some embodiments of the present disclosure.

FIG. 4 is a graph illustrating voltage is applied on the gate to change the depletion width which in turn changes the aperture through which electrons are passing through, i.e. shows the aperture width as a function of gate voltage, according to some embodiments of the present disclosure.

FIG. 5A is a table illustrating a true table, according to some embodiments of the present disclosure, wherein "Vin1" is—input 1—at the E$_3$ electrode, and "Vin2" is—input 2—at the E$_4$ electrode.

FIG. 5B is a table illustrating input and output voltage and conductance states, according to some embodiments of the present disclosure.

Referring to FIG. 5A and FIG. 5B, FIG. 5A shows the truth table of the AND gate, and FIG. 5B shows the corresponding input voltage and output conductance levels. The operating principle of the AND gate can be explained as follows:

Input Logic Level: 00

When the gate bias at input1 and input2 are 0 V, the ballistic electrons can't pass through the fin because of zero aperture width. Hence the detected conductance at the output terminal y is very low referring to 0 state at the output.

Input Logic Level: 01

When the gate bias at input 1 is 0 V and input2 is 5 V the ballistic electrons can't pass through the fins of the first fin because of zero aperture. Even though, the aperture for electrons in the second double slit is maximum, the conductance at the output y is very low referring to 0 state at the output. This is because of the no-supply of electrons from the first fin to the second one.

Input Logic Level: 10

When the gate bias at input 1 is 5 V and input2 is 0 V the ballistic electrons pass through the first fin. This provides electrons at the input of the second fin. But the second fin don't allow the passage of electrons because of zero aperture width and hence the output is at 0 state.

Input Logic Level: 11

When the gate bias at input 1 is 5 V and input2 is 5 V the ballistic electrons pass through the both of the series connected fins, providing abundant electrons to be detected at the output thus the state at the output is 1.

Figure 6A:
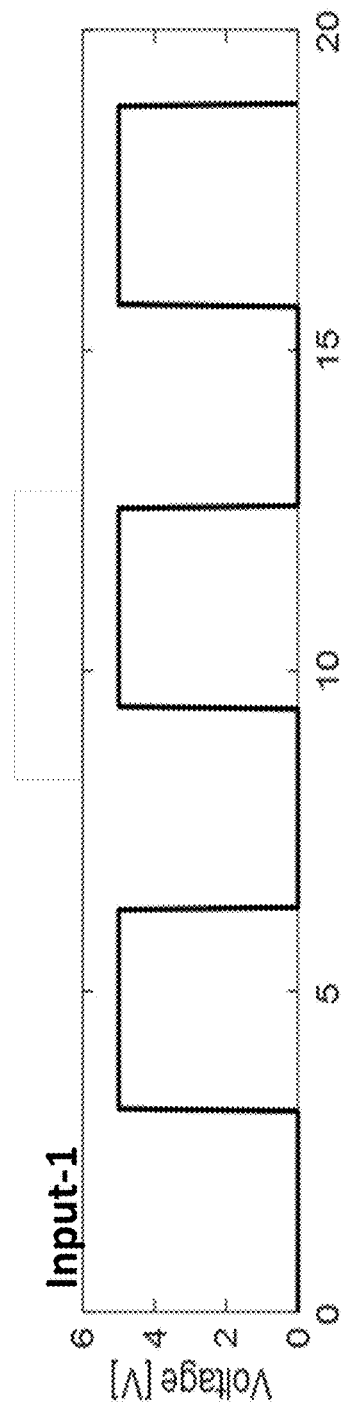
FIG. 6A.
Figure 6B:
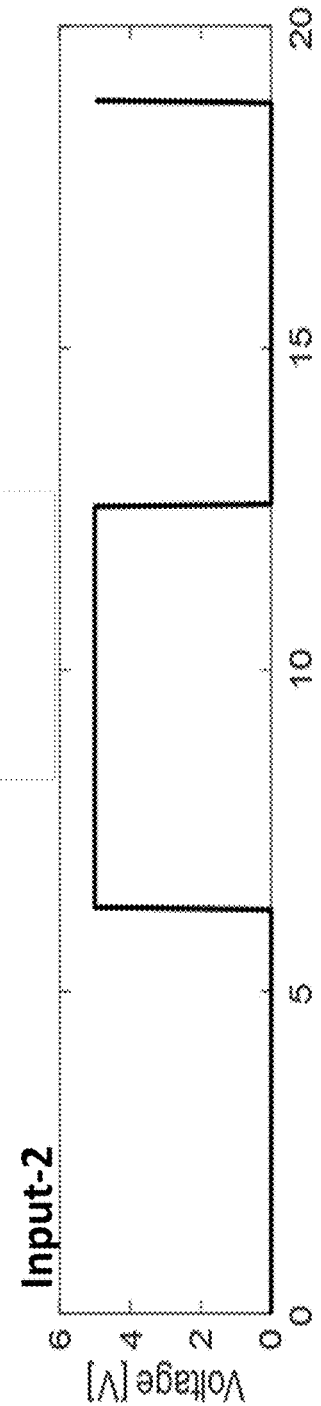
FIG. 6B and FIG. 6C are graphs illustrating Input, Output waveforms for the AND-gate, according to some embodiments of the present disclosure.
Figure 6C:
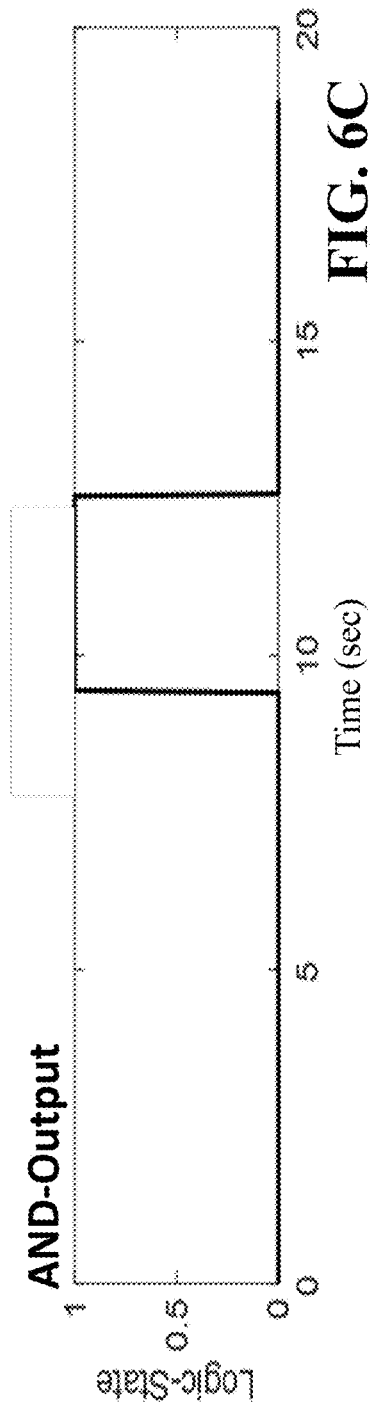

FIG. 6A. FIG. 6B and FIG. 6C are graphs illustrating Input, Output waveforms for the AND gate, according to some embodiments of the present disclosure. Preferably, in an AND gate the output logic state should be 1 when both of the input has 5 V is being applied. FIG. 6A shows the voltage level being applied to the E$_3$ terminal, and FIG. 6B shows the voltage level being applied to E$_4$ terminal at various time. The horizontal axis for FIGS. 6A-6C illustrate the time is seconds (secs), and vertical axis shows the value of the voltages being applied, such that a 0V represents a logic 0 state, and a 5 V means a logic 1 state, from the input perspective. FIG. 6C shows the AND-gate output logic state; logic state 1 means the sensor at the output, received electrons, and logic state 0 means no reception of electrons. What can be noticed in FIG. 6C, is that the output in FIG. 6C is 1, when both of the input is 5 V, otherwise, it is 0, which this is exactly what an AND-gate should do.

Figure 7:
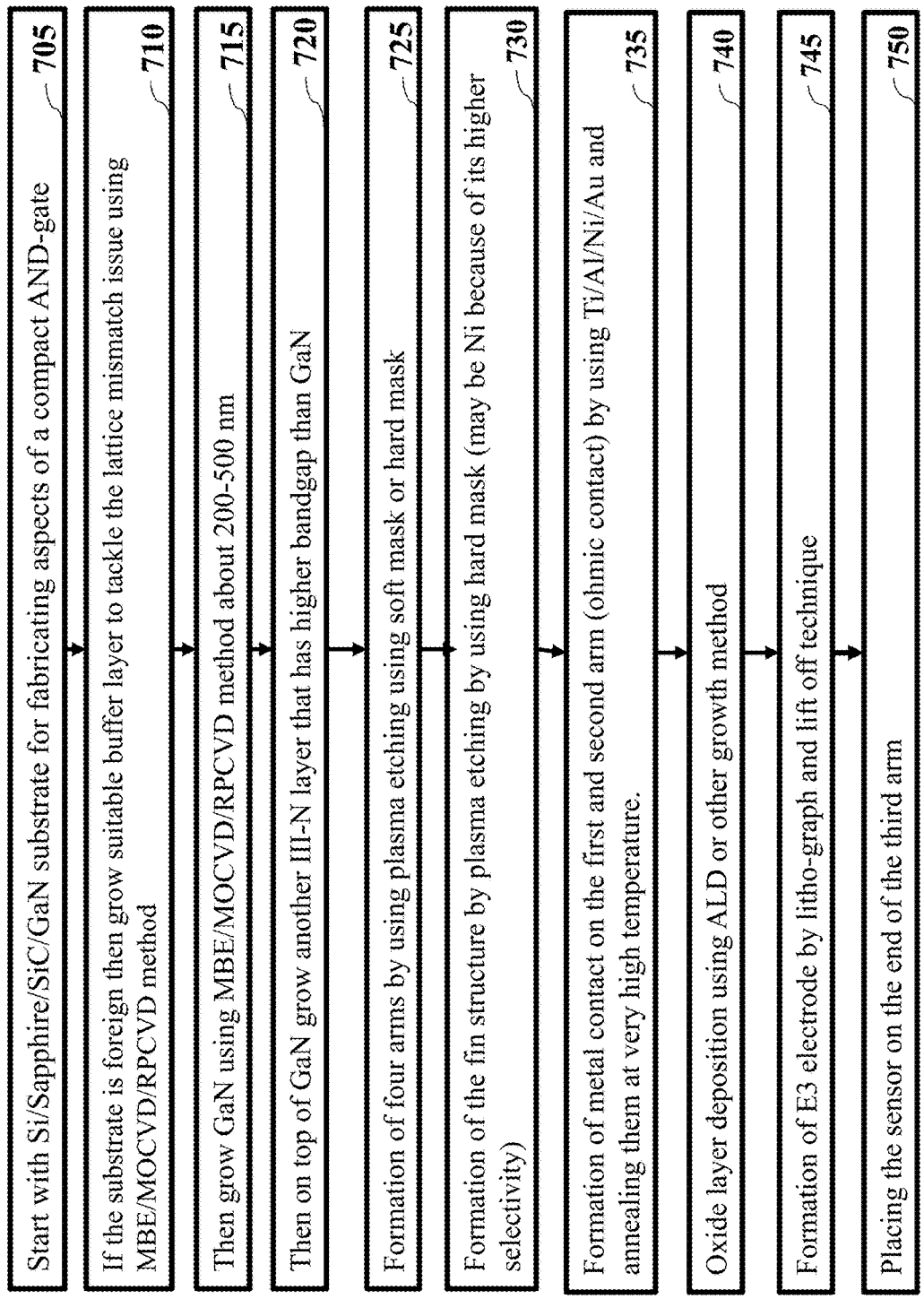
FIG. 7 is a block diagram illustrating some method operation steps for a compact AND-gate, according to some embodiments of the present disclosure.

FIG. 7 is a block diagram illustrating some method operation steps for fabricating aspects for the compact AND-gate device, according to some embodiments of the present disclosure.

Step 705 shows the fabrication of the compact AND-gate device that starts with growing the epi-structure. And the process starts with Si/Sapphire/SiC/GaN wafers. And the size of the wafers could be 2/4/6/12 inches.

Step 710 shows If the wafer is not a GaN wafer, then a buffer layer is grown to tackle the lattice mismatch between the wafer material and the III-N semiconductor.

Then, Step 715 shows GaN semiconductor grown on the buffer layer. This layer thickness could be in the range of 450 nm to several micro-meters. Ideally, we would like to have a thicker layer of GaN as it helps to reduce the defect density in the III-N layers which in turn helps to obtain optimum device performance.

Then, Step 720 shows an III-N layer grown on top of GaN layer. But the III-N layer band gap needs to be higher than the GaN layer. Typically, the thickness of this layer could be 5 nm to 30 nm. The buffer layer, the GaN layer and the III-N layer could be grown by any growth method including but not limited to MBE/MOCVD/RPCVD/PLD/Sputtering and so on.

Step 725 shows after the material growth the device fabrication starts with forming the arms. The arms are formed by dry anisotropic etching mechanism.

During the etching process the photoresist/E-beam resist soft mask or the metal hard mask could be used.

Step 730 shows that typically, the etching is done using ICP-RIE method employing Cl2/BCl3, /Ar gases. The Ni hard mask is formed by E-beam lithio, followed by metal deposition and lift-off process. Then the dry anisotropic etching is performed to create the fins in the third arm.

Step 735 shows that Ti/Al/Ni/Au based ohmic contacts are formed in arm one and two by photo lithography and liftoff process followed by annealing at high temperature. These ohmic contacts serve as the E1 and E2 electrodes.

Step 740 shows that then a very this oxide layer is deposited using atomic layer depiction method. The oxide layer includes but not limited to Al2O3, HfO2, doped HfO2.

Step 745 shows that then the E3 electrode is formed by e-beam lithography, metal deposition and lift-off process. In this step low work function metal is deposited to facilitate the depletion in the fin region without the need for any applied bias at the E3 electrode.

Step 750 shows that then the sensor to detect the electrons are placed at the edge of the third arm of the compact AND-gate.

Features

An AND-gate device having a first arm, a second arm and a third arm. Such that a channel from the first and second arms extends to a channel of the third arm. When a current from a first voltage is flowing from a first electrode of the first arm to a second electrode of the second arm, a flow of ballistic electrons are generated that flow through the third arm channel from the channel of the first and second arms to the third arm channel. The AND-gate including at least two structures are positioned in series in the third arm channel, each structure includes a fin structure located in the third arm. Wherein the fin structure includes a gate formed transversely to a longitudinal axis of the fin structure, and is controlled using an individual voltage applied to an electrode of the fin structure. Wherein the fin structure is formed to induce an electric-field structure that is shifted by an amount of the voltage to control an opening of the gate that the flow of ballistic electrons is passing through. At least one sensor is positioned at an end of the third arm. Wherein the AND-gate device is turned on by applying an amount of voltage to both electrodes of the at least two fin structures, and turned off by applying no amounts of voltage to either of the electrodes of the at least two fin structures. The following aspects are intended to either individually or in combination, create one or more embodiments based on the one or more combination of aspects listed below.

According to aspects of the present disclosure, the first and second arms are configured as a cross shaped structure, to generate the flow of the ballistic electrons, such that a fourth arm extends along a vertical axis above the second arm.

According to aspects of the present disclosure, the ballistic electrons are flowing at a high velocity such as at about $2 \times 10^7$ cm. sec$^{-1}$. Wherein another aspect can be that the at least one sensor is configured to operationally detect an amount of conductance (optionally, including a $10^{-2}$ S amount of conductance to a $10^3$ S amount of conductance). Wherein the detected amount of conductance is associated with an order of magnitude, such that the order of magnitude changes depending upon the voltage applied to the gate.

According to aspects of the present disclosure, the flow of ballistic electrons is generated by an epitaxial layer of InAlN/GaN, such that a predetermined amount of Indium concentration is tuned to lattice match with GaN, resulting in higher electron mobility.

According to aspects of the present disclosure, the first voltage and second voltage are connected to a same ground terminal.

According to aspects of the present disclosure, each fin structure is a U-shaped structure having a lateral portion and two upright portions integrally formed with, and extending along a portion of the lateral portion and forming the fin structure with a U-shaped cross section, the U-shaped structure includes the electrode and a layer of an oxide material wrapped along an interior surface of the electrode.

Definitions

According to aspects of the present disclosure, and based on experimentation, the following definitions have been established, and certainly are not a complete definition of each phrase or term. Wherein the provided definitions are merely provided as an example, based upon learnings from experimentation, wherein other interpretations, definitions, and other aspects may pertain. However, for at least a mere basic preview of the phrase or term presented, such definitions have been provided.

Ballistic Electrons or Ballistic conduction: In mesoscopic physics, ballistic conduction (ballistic transport) is the transport of charge carriers (usually electrons) in a medium, having negligible electrical resistivity caused by scattering. Without scattering, electrons simply obey Newton's second law of motion at non-relativistic speeds. In general, the resistivity of a material exists because an electron, while moving inside a medium, is scattered by impurities, defects, thermal fluctuations of ions in a crystalline solid, or, generally, by any freely-moving atom/molecule composing a gas or liquid. For a given particle, a mean free path can be described as being the average length that the electron can travel freely, i.e., before a collision, which could change its momentum. The mean free path can be increased by reducing the number of impurities in a crystal or by lowering its temperature. Ballistic transport is observed when the mean free path of the electron is (much) longer than the dimension of the medium through which the electron travels. The electron alters its motion only upon collision with the walls. In the case of a wire suspended in air/vacuum the surface of the wire plays the role of the box reflecting the electrons and preventing them from exiting toward the empty space/open air. This is because there is an energy to be paid to extract the electron from the medium (work function).

For example, ballistic transport can be observed in a metal nanowire: this is simply because the wire is of the size of a nanometer (10-9 meters) and the mean free path can be longer than that in a metal. Ballistic conduction is the unimpeded flow of charge, or energy-carrying particles, over relatively long distances in a material. Normally, transport of electrons (or holes) is dominated by scattering events, which relax the carrier momentum in an effort to bring the conducting material to equilibrium. Thus, ballistic transport in a material is determined by how ballistically conductive that material is. Ballistic conduction differs from superconductivity due to the absence of the Meissner effect in the material. A ballistic conductor would stop conducting if the driving force is turned off, whereas in a superconductor current would continue to flow after the driving supply is disconnected. Ballistic conduction is typically observed in quasi-1D structures, such as carbon nanotubes or silicon nanowires, because of extreme size quantization effects in these materials. Ballistic conduction is not limited to electrons (or holes) but can also apply to phonons. It is theoretically possible for ballistic conduction to be extended to other quasi-particles, but this has not been experimentally verified.

Ballistic conduction enables use of quantum mechanical properties of electron wave functions. Ballistic transport is coherent in wave mechanics terms. Phenomena like double-slit interference, spatial resonance (and other optical or microwave-like effects) could be exploited in electronic systems at nanoscale in systems including nanowires and nanotubes. The widely encountered phenomenon of electrical contact resistance or ECR, arises as an electric current flowing through a rough interface is restricted to a limited number of contact spots. The size and distribution of these contact spots is governed by the topological structures of the contacting surfaces forming the electrical contact. In particular, for surfaces with high fractal dimension contact spots may be very small. In such cases, when the radius of the contact spot is smaller than the mean free path of electrons Λ (lambda), the resistance is dominated by the Sharvin mechanism, in which electrons travel ballistically through these micro-contacts with resistance that can be described by the following:

$$R_S = \frac{\lambda(\rho_1 + \rho_2)}{2a}.$$

This term, where $\rho_1$ and $\rho_2$ correspond to the specific resistivity of the two contacting surfaces, is known as Sharvin resistance. Electrical contacts resulting in ballistic electron conduction are known as Sharvin Contacts. When the radius of a contact spot is larger than the mean free path of electrons, the contact resistance can be treated classically.

Depletion Width: In semiconductor physics that includes the compact AND-gate of the present disclosure, the depletion region, also called depletion layer, depletion zone, junction region, space charge region or space charge layer, is an insulating region within a conductive, doped semiconductor material where the mobile charge carriers have been diffused away, or have been forced away by an electric field. The only elements left in the depletion region are ionized donor or acceptor impurities. The depletion region is so named because it is formed from a conducting region by removal of all free charge carriers, leaving none to carry a current. Understanding the depletion region is key to explaining modern semiconductor electronics: diodes, bipolar junction transistors, field-effect transistors, and variable capacitance diodes all rely on depletion region phenomena. A depletion region forms instantaneously across a p-n junction. It is most easily described when the junction is in thermal equilibrium or in a steady state: in both of these cases the properties of the system do not vary in time; they have been called dynamic equilibrium. Electrons and holes diffuse into regions with lower concentrations of them, much as ink diffuses into water until it is uniformly distributed. By definition, the N-type semiconductor has an excess of free electrons (in the conduction band) compared to the P-type semiconductor, and the P-type has an excess of holes (in the valence band) compared to the N-type. Therefore, when N-doped and P-doped semiconductors are placed together to form a junction, free electrons in the N-side conduction band migrate (diffuse) into the P-side conduction band, and holes in the P-side valence band migrate into the N-side valence band. Following transfer, the diffused electrons come into contact with holes and are eliminated by recombination in the P-side. Likewise, the diffused holes are recombined with free electrons so eliminated in the N-side. The net result is that the diffused electrons and holes are gone. In a N-side region near to the junction interface, free electrons in the conduction band are gone due to (1) the diffusion of electrons to the P-side and (2) recombination of electrons to holes that are diffused from the P-side. Holes in a P-side region near to the interface are also gone by a similar reason. As a result, majority charge carriers (free electrons for the N-type semiconductor, and holes for the P-type semiconductor) are depleted in the region around the junction interface, so this region is called the depletion region or depletion zone. Due to the majority charge carrier diffusion described above, the depletion region is charged; the N-side of it is positively charged and the P-side of it is negatively charged. This creates an electric field that provides a force opposing the charge diffusion. When the electric field is sufficiently strong to cease further diffusion of holes and electrons, the depletion region reached the equilibrium. Integrating the electric field across the depletion region determines what is called the built-in voltage (also called the junction voltage or barrier voltage or contact potential). Physically speaking, charge transfer in semiconductor devices is from (1) the charge carrier drift by the electric field and (2) the charge carrier diffusion due to the spatially varying carrier concentration. In the P-side of the depletion region, where holes drift by the electric field with the electrical conductivity σ and diffuse with the diffusion constant D, the net current density is given by J=σE−eD∇p, where E is the electric field, e is the elementary charge (1.6×10-19 coulomb), and p is the hole density (number per unit volume). The electric field make holes' drift along the field direction, and for diffusion holes move in the direction of decreasing concentration, so for holes a negative current result for a positive density gradient. (If the carriers are electrons, the hole density p is replaced by the electron density n with negative sign; in some cases, both electrons and holes must be included.) When the two current components balance, as in the p-n junction depletion region at dynamic equilibrium, the current is zero due to the Einstein relation, which relates D to σ.

Depletion width in regard to forward bias, forward bias is (applying a positive voltage to the P-side with respect to the N-side) narrows the depletion region and lowers the barrier to carrier injection. In more detail, majority carriers get some energy from the bias field, enabling them to go into the region and neutralize opposite charges. The more bias the more neutralization (or screening of ions in the region) occurs. The carriers can be recombined to the ions but thermal energy immediately makes recombined carriers transition back as Fermi energy is in proximity. When bias is strong enough that the depletion region becomes very thin, the diffusion component of the current (through the junction interface) greatly increases and the drift component decreases. In this case, the net current flows from the P-side to the N-side. The carrier density is large (it varies exponentially with the applied bias voltage), making the junction conductive and allowing a large forward current. The mathematical description of the current is provided by the Shockley diode equation. The low current conducted under reverse bias and the large current under forward bias is an example of rectification. In regard to reverse bias, (applying a negative voltage to the P-side with respect to the N-side), the potential drop (i.e., voltage) across the depletion region increases. Essentially, majority carriers are pushed away from the junction, leaving behind more charged ions. Thus, the depletion region is widened and its field becomes stronger, which increases the drift component of current (through the junction interface) and decreases the diffusion component. In this case, the net current flows from the N-side to the P-side. The carrier density (mostly, minority carriers) is small and only a very small reverse saturation current flow.

Interference: Sending particles through a controllable gate or a double slit device, one at a time results in single particles appearing on a screen. Wherein an interference pattern emerges when these particles are allowed to build up one by one. This demonstrates the wave-particle duality, which states that all matter exhibits both wave and particle properties: the particle is measured as a single pulse at a single position, while the wave describes the probability of absorbing the particle at a specific place on the screen. This phenomenon is shown to occur with photons and electrons. So, experiments with electrons add confirmatory evidence to the view that electrons, protons, neutrons, and even larger entities that are ordinarily called particles nevertheless have their own wave nature and even a wavelength (related to their momentum). The probability of detection is the square of the amplitude of the wave and can be calculated with classical waves. The particles do not arrive at the screen in a predictable order, so knowing where all the previous particles appeared on the screen and in what order tells nothing about where a future particle will be detected. If there is a cancellation of waves at some point, that does not mean that a particle disappears; it will appear somewhere else. Ever since the origination of quantum mechanics, some theorists have searched for ways to incorporate additional determinants or "hidden variables" that, were they to become known, would account for the location of each individual impact with the target.

Interference Pattern: An overall pattern that results when two or more waves interfere with each other, generally showing regions of constructive and of destructive interference.

Wave Nature of Electrons: Waves involve the transport of energy without the transport of matter. In conclusion, a wave can be described as a disturbance that travels through a medium, transporting energy from one location (its source) to another location without transporting matter. And Wave exhibits interesting properties like interference diffraction and so on and is often characterised by wave length. In case of electron the wave length of an electron is dependent on its velocity and is governed by the following equation, $\lambda=h/(mv)$.

Free Particle: For example, consider a free particle. In quantum mechanics, a free matter is described by a wave function. The particle properties of the matter become apparent when we measure its position and velocity. The wave properties of the matter become apparent when we measure its wave properties like interference. The wave-particle duality feature is incorporated in the relations of coordinates and operators in the formulation of quantum mechanics. Since the matter is free (not subject to any interactions), its quantum state can be represented as a wave of arbitrary shape and extending over space as a wave function. The position and momentum of the particle are observables. The Uncertainty Principle states that both the position and the momentum cannot simultaneously be measured with complete precision. However, one can measure the position (alone) of a moving free particle, creating an eigenstate of position with a wave function that is very large (a Dirac delta) at a particular position x, and zero everywhere else. If one performs a position measurement on such a wave function, the resultant x will be obtained with 100% probability (i.e., with full certainty, or complete precision). This is called an eigenstate of position—or, stated in mathematical terms, a generalized position eigenstate (Eigendistribution). If the particle is in an eigenstate of position, then its momentum is completely unknown. On the other hand, if the particle is in an eigenstate of momentum, then its position is completely unknown. In an eigenstate of momentum having a plane wave form, it can be shown that the wavelength is equal to h/p, where h is Planck's constant and p is the momentum of the eigenstate.

Qubit: The qubit or quantum bit is the basic container of information in a QC, replacing the bit in a conventional computer. The qubit can be in both ground and excited states at the same time. The two logical states of each qubit must be mapped onto the eigenstates of some suitable physical system. The most straightforward example is the spin. A spin qubit relies on a spin degree of freedom of either electronic or nuclear nature, which can hold a bit of quantum information for very long times. Note that there are many other examples of qubits: two different polarizations of a photon, two energy states of an electron orbiting a single atom, etc. The quantum computer is fundamentally different than a classical computer due to two distinct properties of qubits. The first property is 'quantum superposition' or the linear combination of possible configurations. The second one is 'quantum entanglement'.

Conductance Variation Pattern: Conductance is dependent on the number of electrons available at a particular point in a semiconductor. Higher electron concentration refers to higher conductance and vice versa.

Detected amount of conductance is associated with an order of magnitude: . . . Absence of electrons in a semiconductor can lead to significant reduction in conductance.

Detected amount of the conductance level, results in an operation of the semiconductor device as an inverter: When the gate voltage is 0 V (input logic state 0) it lets the electrons pass through the fin and at the out put terminal it gets detected as high conductance state which refers to output logic state 1. Similarly, when the input voltage is 5 V (input logic state 1), it depletes the fin channel. At the output terminal no electrons get detected referring to low conductance. Therefore, the output logic state is 0 when the input state is 1. This completes the operation of an inverter.

Heterojunction: A heterojunction is the interface that occurs between two layers or regions of dissimilar crystalline semiconductors. These semiconducting materials have unequal band gaps as opposed to a homojunction. It is often advantageous to engineer the electronic energy bands in many solid-state device applications, including semiconductor lasers, solar cells and transistors to name a few. The combination of multiple heterojunctions together in a device is called a heterostructure, although the two terms are commonly used interchangeably. The requirement that each material be a semiconductor with unequal band gaps is somewhat loose, especially on small length scales, where electronic properties depend on spatial properties. A more modern definition of heterojunction is the interface between any two solid-state materials, including crystalline and amorphous structures of metallic, insulating, fast ion conductor and semiconducting materials.

Effective Mass Mismatch (heterojunction): When a heterojunction is formed by two different semiconductors, a quantum well can be fabricated due to difference in band structure. In order to calculate the static energy levels within the achieved quantum well, understanding variation or mismatch of the effective mass across the heterojunction becomes substantial. The quantum well defined in the heterojunction can be treated as a finite well potential with width of $l_w$. Boundary condition for the envelope function in quantum well, known as BenDaniel-Duke boundary condition, such that the envelope function in fabricated quantum well must satisfy boundary condition which $$\psi(z), \frac{1}{m^*}\frac{\partial}{\partial z}\psi(z)$$

are both continuous in interface regions.

Manufacture (heterojunction): Heterojunction manufacturing generally requires the use of molecular beam epitaxy (MBE) or chemical vapor deposition (CVD) technologies in order to precisely control the deposition thickness and create a cleanly lattice-matched abrupt interface. Commonly, there are two steps for manufacturing heterojunction:

Preparation of Two-dimensional layered materials. The synthesis of 2D monolayers mainly include the top-down strategy and the bottom-up strategy.

Top-down: Micromechanical Exfoliation. Simple as it seems, this technique is able to yield high-quality 2D crystal flaks, applied to many common-used 2D materials, such as graphene, $MoS_2$, $WSe_2$.

Bottom-up: Chemical vapor deposition (CVD). This method is mainly used to prepare larger films with more stable quality. One of the most popular application is to adopt it for growing $MoS_2$ uses S and $MoO_3$ as precursors.

Heterostructure assembly. Van der Waals heterojunction (vdWH) can be fabricated by staking prepared monolayer. Both top-down and bottom-up approaches can be applied.

Top-down: Exfoliation and restacking approach. The first layer should be attached onto a substrate. The second layer can be transferred onto a transparent stamp with sacrificial polymer by wet or dry transfer techniques. The stacking of sheets should be precisely conducted under micromanipulators, and then remove the polymer stamp. This is the most widely applied method.

Bottom-up: Direct CVD growth of heterostructure layers on top of each other. The growing conditions need to be precisely controlled. For example, graphene, h-BN and TMD vdWHs can be prepared this way.

Energy Band Alignment (heterojunction): The behavior of a semiconductor junction depends crucially on the alignment of the energy bands at the interface. Semiconductor interfaces can be organized into three types of heterojunctions: straddling gap (type I), staggered gap (type II) or broken gap (type III) as seen in the figure. Away from the junction, the band bending can be computed based on the usual procedure of solving Poisson's equation. Various models exist to predict the band alignment.

The simplest (and least accurate) model is Anderson's rule, which predicts the band alignment based on the properties of vacuum-semiconductor interfaces (in particular the vacuum electron affinity). The main limitation is its neglect of chemical bonding.

A common anion rule was proposed which guesses that since the valence band is related to anionic states, materials with the same anions should have very small valence band offsets. This however did not explain the data but is related to the trend that two materials with different anions tend to have larger valence band offsets than conduction band offsets.

Tersoff proposed a gap state model based on more familiar metal-semiconductor junctions where the conduction band offset is given by the difference in Schottky barrier height. This model includes a dipole layer at the interface between the two semiconductors which arises from electron tunneling from the conduction band of one material into the gap of the other (analogous to metal-induced gap states). This model agrees well with systems where both materials are closely lattice matched such as GaAs/AlGaAs.

The 60:40 rule is a heuristic for the specific case of junctions between the semiconductor GaAs and the alloy semiconductor $Al_xGa_{1-x}As$. As the x in the $Al_xGa_{1-x}As$ side is varied from 0 to 1, the ratio $\Delta E_C/\Delta E_V$ tends to maintain the value 60/40. For comparison, Anderson's rule predicts $\Delta E_C/\Delta E_V=0.73/0.27$ for a GaAs/AlAs junction (x=1).

The typical method for measuring band offsets is by calculating them from measuring exciton energies in the luminescence spectra.

Embodiments

The following description provides exemplary embodiments only, and is not intended to limit the scope, applicability, or configuration of the disclosure. Rather, the following description of the exemplary embodiments will provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

In addition, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed, but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, with machines, hardware, software, firmware, middleware, microcode, hardware description languages, or any combination thereof. When implemented in software, firmware, middleware or microcode, the program code or code segments to perform the necessary tasks may be stored in a machine-readable medium. A processor(s) may perform the necessary tasks.

Further, embodiments of the present disclosure and the functional operations described in this specification can be implemented in digital electronic circuitry, in tangibly embodied computer software or firmware, in computer hardware, including the structures disclosed in this specification and their structural equivalents, or in combinations of one or more of them. Further, some embodiments of the present disclosure can be implemented as one or more computer programs, i.e., one or more modules of computer program instructions encoded on a tangible non-transitory program carrier for execution by, or to control the operation of, data processing apparatus. Further still, program instructions can be encoded on an artificially generated propagated signal, e.g., a machine-generated electrical, optical, or electromagnetic signal that is generated to encode information for transmission to suitable receiver apparatus for execution by a data processing apparatus. The computer storage medium can be a machine-readable storage device, a machine-readable storage substrate, a random or serial access memory device, or a combination of one or more of them.

According to embodiments of the present disclosure, the term "data processing apparatus" can encompass all kinds of apparatus, devices, and machines for processing data, including by way of example a programmable processor, a computer, or multiple processors or computers. The apparatus can include special purpose logic circuitry, e.g., an FPGA (field programmable gate array) or an ASIC (application specific integrated circuit). The apparatus can also include, in addition to hardware, code that creates an execution environment for the computer program in question, e.g., code that constitutes processor firmware, a protocol stack, a database management system, an operating system, or a combination of one or more of them.

A computer program (which may also be referred to or described as a program, software, a software application, a module, a software module, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code. A computer program can be deployed to be executed on one computer or on multiple computers that are located at one site or distributed across multiple sites and interconnected by a communication network. Computers suitable for the execution of a computer program include, by way of example, can be based on general or special purpose microprocessors or both, or any other kind of central processing unit. Generally, a central processing unit will receive instructions and data from a read only memory or a random-access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship to each other.

Although the present disclosure has been described with reference to certain preferred embodiments, it is to be understood that various other adaptations and modifications can be made within the spirit and scope of the present disclosure. Therefore, it is the aspect of the append claims to cover all such variations and modifications as come within the true spirit and scope of the present disclosure.

What is claimed is:

1. An AND-gate device, comprising:
    an epitaxial layer having a III-N heterostructure forming a channel, wherein the III-N heterostructure includes an InAlN/GaN composition formed by an InAlN layer and a GaN layer, wherein a concentration of In in the InAlN layer is tuned to lattice match the InAlN layer with the GaN layer, allowing electron mobility to generate ballistic electrons; and
    at least two fin structures including a first fin structure and a second fin structure positioned in series in the channel,
    wherein the first fin structure includes a first gate controlled by a first voltage and the second fin structure includes a second gate controlled by a second voltage;
        wherein the first gate is formed transversely to a longitudinal axis of the channel, and is controlled using the first voltage applied over the first gate to induce an energy-field opening a first flow of ballistic electrons passing under the first gate, which in turn changes a depletion width, subjecting the ballistic electrons to interference;
        wherein the second gate is formed transversely to the longitudinal axis of the channel, and is controlled using the second voltage applied over the second gate to induce a second energy-field opening a second flow of ballistic electrons passing under the second gate, which in turn changes a second depletion width, subjecting the ballistic electrons to interference; and
    wherein the AND-gate device is turned on by applying the first voltage to the first gate and the second voltage to the second gate, and turned off by not applying the first voltage to the first gate, not applying the second voltage to the second gate, or both not applying the first voltage to the first gate and not applying the second voltage to the second gate.

2. The AND-gate device of claim 1, further comprising:
at least one sensor located at the end of the channel and operatively connected to an ohmic contact of the channel serving as an output terminal to detect a conductance.

3. The AND-gate device of claim 2, having a first arm, a second arm and a third arm arranged to form the channel in the third arm such that a current flowing from a first electrode of the first arm to a second electrode of the second arm allows generating the flow of the ballistic electrons through the channel in the third arm.

4. The AND-gate device of claim 3, wherein the first and second arms are configured as a cross shaped structure, to generate the flow of the ballistic electrons, further comprising:
a fourth arm that extends along a vertical axis above the second arm.

5. The AND-gate device of claim 3, wherein the detected conductance is associated with an order of magnitude, such that the order of magnitude changes depending upon the first voltage applied to the first gate and the second voltage applied to the second gate.

6. The AND-gate device of claim 1, wherein the ballistic electrons are flowing at a high velocity of about $2 \times 10^7$ cm.sec$^{-1}$.

7. The AND-gate device of claim 1, wherein the first voltage and the second voltage are connected to a same ground terminal.

8. The AND-gate device of claim 1, wherein at least one of the first fin structure and the second fin structure is a U-shaped structure having a lateral portion and two upright portions integrally formed with, and extending along a portion of the lateral portion and forming the U-shaped structure with a U-shaped cross-section, the U-shaped structure includes the first gate or the second gate and a layer of an oxide material wrapped along an interior surface of the first gate or the second gate.

9. A quantum computer including the AND-gate device of claim 1.

10. The quantum computer of claim 9, comprising:
an NbN layer grown on top of the GaN layer.

11. An AND-gate device including a structure having a first arm, a second arm, a third arm, and a fourth arm, such that a channel formed by the first and second arms extends to a channel of the third arm, and wherein when a current is flowing from a first electrode of the first arm to a second electrode of the second arm, a flow of ballistic electrons flow through the channel of third arm from the channel formed by the first and second arms, wherein the first electrode and the second electrode are connected to a same ground terminal, wherein the fourth arm is positioned to extend along a vertical axis above the second arm, comprising:
at least two input structures including a first fin structure and a second fin structure positioned in series in the channel of the third arm,
wherein the first fin structure includes a first gate formed transversely to a first longitudinal axis of the first fin structure, and is controlled using a first voltage, wherein the first fin structure is formed to induce an electric-field shifted proportionally to an amount of the first voltage to control an opening of the first gate such that the flow of ballistic electrons is passing through;
wherein the second fin structure includes a second gate formed transversely to a second longitudinal axis of the second fin structure, and is controlled using a second individual voltage, wherein the second fin structure is formed to induce a second electric-field shifted proportionally to an amount of the second voltage to control an opening of the second gate such that the flow of ballistic electrons is passing through,
at least one sensor positioned at an end of the third arm, such that as the first voltage is applied to the first gate and the second voltage is applied to the second gate, the at least one sensor detects conductance,
wherein the AND-gate device is turned on by applying the first voltage to the first gate and the second voltage to the second gate, and turned off by not applying the first voltage to the first gate, not applying the second voltage to the second gate, or both not applying the first voltage to the first gate and not applying the second voltage to the second gate.

* * * * *